US011715972B2

(12) United States Patent
Torres Carino et al.

(10) Patent No.: US 11,715,972 B2
(45) Date of Patent: Aug. 1, 2023

(54) EXTERNAL AND INTERNAL POWER MANAGEMENT FOR EMBEDDED ELECTRONIC DEVICES

(71) Applicant: THE MOREY CORPORATION, Woodridge, IL (US)

(72) Inventors: Ismael Alejandro Torres Carino, Woodridge, IL (US); Nicholas C. Carter, Woodridge, IL (US); Richard Earl, Woodridge, IL (US); Mauro Hernandez Castro, Woodridge, IL (US); Joel Jasso Calderon, Woodridge, IL (US); Michael Podgorny, Woodridge, IL (US)

(73) Assignee: THE MOREY CORPORATION, Woodridge, IL (US)

( * ) Notice: Subject to any disclaimer, the term of this patent is extended or adjusted under 35 U.S.C. 154(b) by 0 days.

(21) Appl. No.: 17/463,071

(22) Filed: Aug. 31, 2021

(65) Prior Publication Data

US 2022/0103008 A1 Mar. 31, 2022

Related U.S. Application Data

(60) Provisional application No. 63/072,490, filed on Aug. 31, 2020.

(51) Int. Cl.
*H02J 9/06* (2006.01)
*H02J 7/00* (2006.01)
*G01R 31/00* (2006.01)
*B60R 16/023* (2006.01)
*G07C 5/08* (2006.01)

(52) U.S. Cl.
CPC .......... *H02J 9/061* (2013.01); *B60R 16/0232* (2013.01); *G01R 31/007* (2013.01); *G07C 5/0808* (2013.01); *H02J 7/0036* (2013.01); *H02J 7/0047* (2013.01); *H02J 7/00306* (2020.01)

(58) Field of Classification Search
CPC ...... H02J 9/061; H02J 7/00306; H02J 7/0036; H02J 7/0047; B60R 16/0232; G01R 31/007; G07C 5/0808
See application file for complete search history.

(56) References Cited

U.S. PATENT DOCUMENTS

2021/0351608 A1* 11/2021 Cook .................. G05B 19/042

* cited by examiner

*Primary Examiner* — Carlos Amaya
(74) *Attorney, Agent, or Firm* — Barnes & Thornburg LLP; Mark J. Nahnsen

(57) ABSTRACT

A power management system is provided to manage internal and external power sources for an embedded electronic device. The power management system includes an internal power source and an external power source. The power management system determines when to power the internal embedded electronic device or devices from either the internal or external power source, when to recharge the internal power source, when to shut down the internal embedded electronic device so as not to over discharge and damage the internal power source when external power is not available.

18 Claims, 3 Drawing Sheets

EXTERNAL AND INTERNAL POWER MANAGEMENT FOR EMBEDDED ELECTRONIC DEVICES

PRIORITY CLAIM

This application claims priority under 35 U.S.C. § 119(e) to U.S. Provisional Application Ser. No. 63/072,490, filed Aug. 31, 2022, which is expressly incorporated herein by reference in its entirety.

FIELD OF THE INVENTION

The invention is related to the field of power controllers and power management systems for electronic devices.

BACKGROUND OF THE INVENTION

Embedded electronic devices are typically integrated into larger and more complex systems, which are known as "assets." One such asset could be a motor vehicle, which has a complex electrical system. Such devices are typically powered from the overall asset's power source, which can include an alternator and a battery. Inadequate device power management may produce a power consumption greater than what the overall asset was designed to handle. Over time, the additional power draw from the embedded electronic device drains the asset's power, thus rendering the asset unable to perform its primary functions, and in some occasions even starving the very same device from power. In the case of a motor vehicle, depriving the asset of power will render the vehicle inoperable. The inclusion of reserve power source on-board the device may alleviate the burden on the asset's power source, but depending solely on it limits the operation and performance of the device.

SUMMARY OF THE INVENTION

In accordance with the present disclosure, a power management system is provided to manage internal and external power sources for an embedded electronic device.

In illustrated embodiments, the power management system is adapted to manage internal and external power sources for an embedded electronic device. The system includes an internal power source in the form of a battery and an external power source such as 12 volt power from a vehicle or 24 volt power source. The power management system determines when to power the internal electronic device or devices from either the internal or external power source, when to charge the internal power source, when to shut down the internal electronic device so as not to over discharge and damage the internal power source when external power is not available.

In illustrated embodiments, the system also determines whether the external power source is providing too much or too little power (The present system measures external and internal voltage to make determinations), and when to execute a reduced power consumption profile of the electronic device. The system is designed to switch between internal and external power without disrupting the function of the embedded electronic device.

In illustrated embodiments, the system is adapted to distribute the burden of power draw between the asset's power source (external power to the device) and the device's on-board power source (internal power to the device). A proper device power management strategy will protect the asset's power source (so it can still perform its primary functions) and the device's on-board power source (to prevent its degradation or damage). The strategy requires adapting the device's function and controlling its power consumption profile. The former may change active functionality of the device, and the latter may change, how much, and from where (externally or internally) the device draws power to operate.

Additional features of the disclosure will become apparent to those skilled in the art upon consideration of the following detailed description of illustrative embodiments exemplifying the best mode of carrying out the disclosure as presently perceived.

BRIEF DESCRIPTION OF THE DRAWINGS

The detailed description particularly refers to the accompanying figures in which.

DETAILED DESCRIPTION

Figure 1:
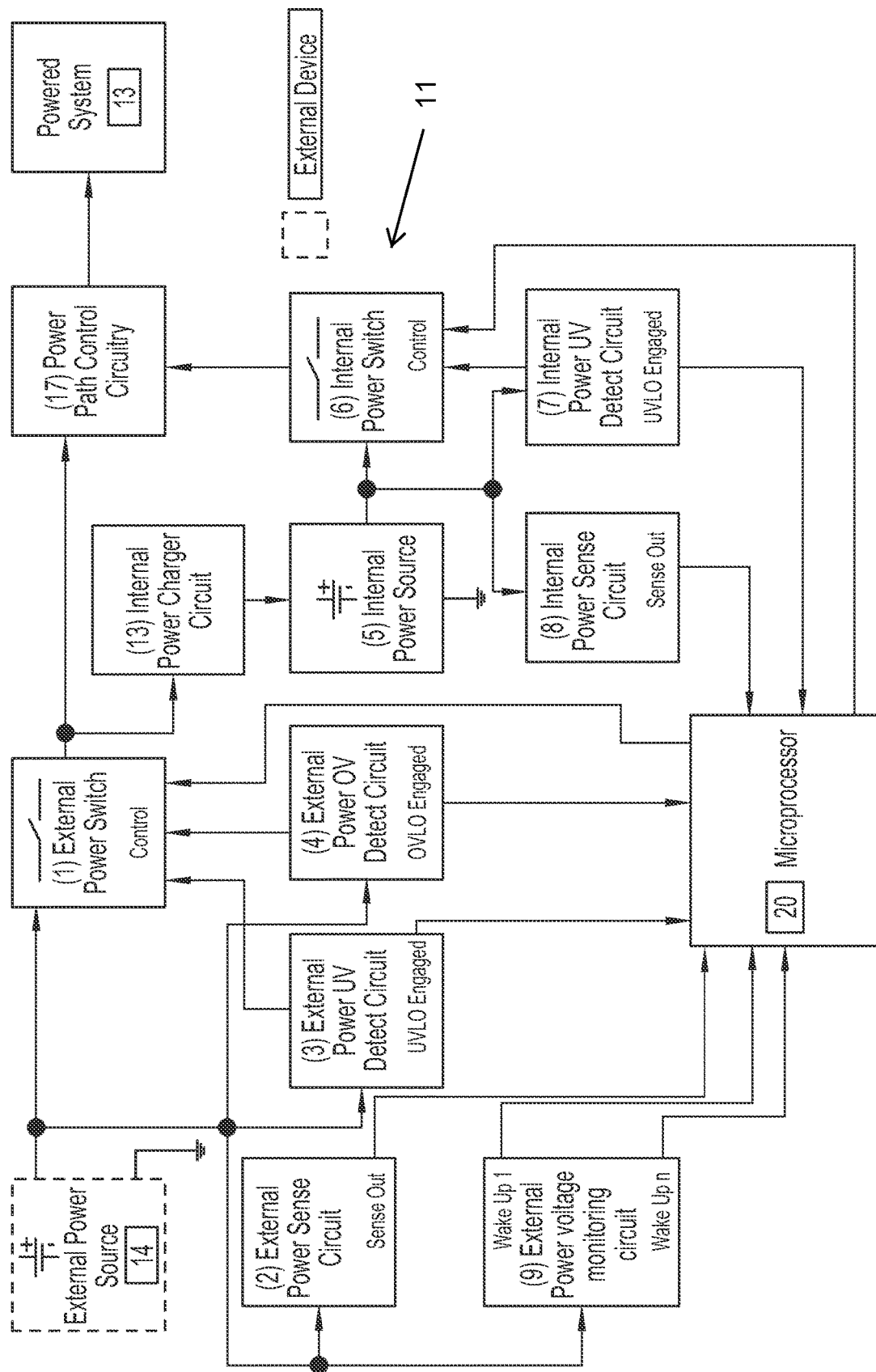
FIG. 1 is a circuit diagram of the power management system.
Figure 2:
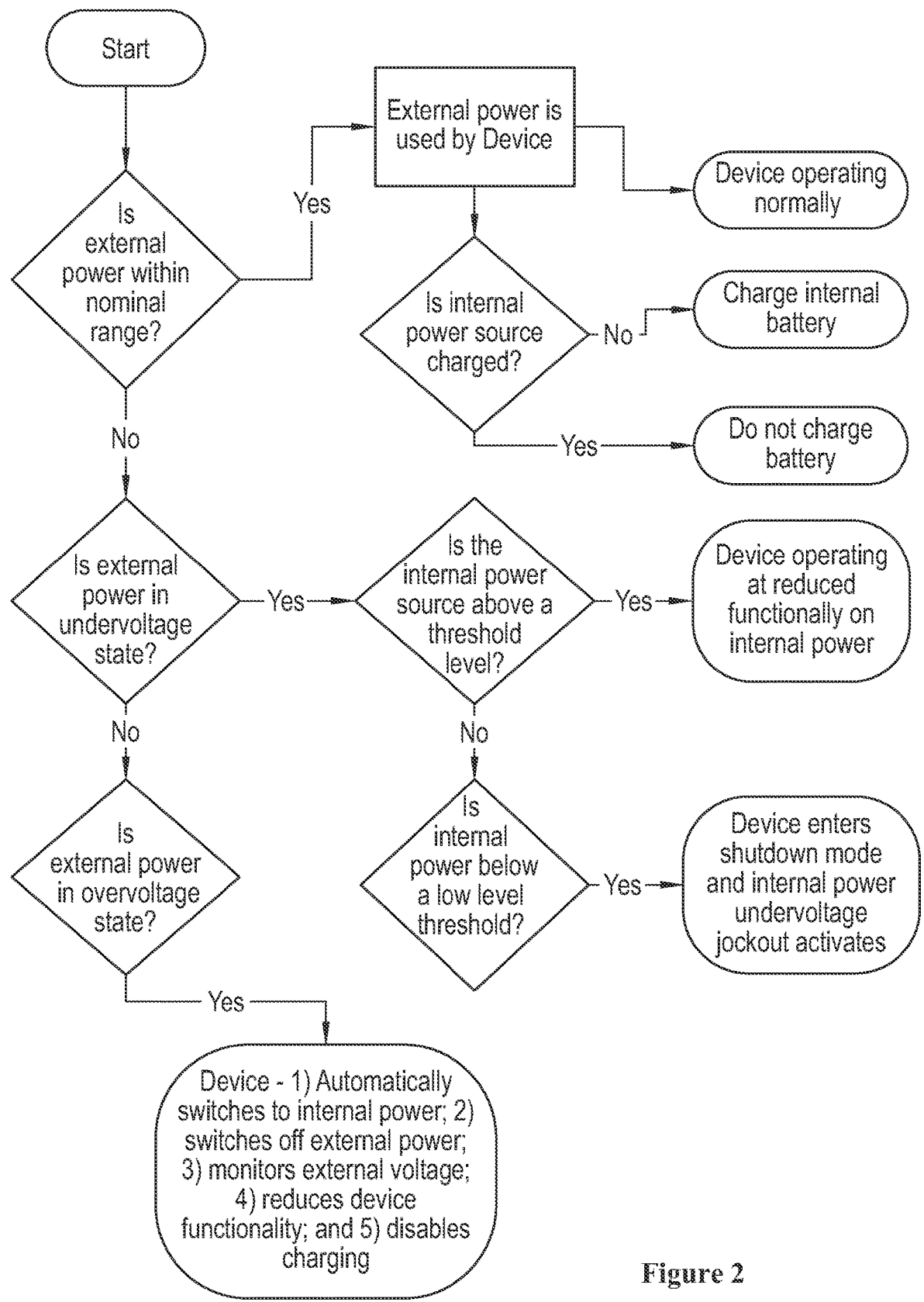
FIG. 2 is a flow diagram of the power management system.

Power management system 11 of embedded device is adapted to engage or disengage power draw from an external power source 14 of an asset, such as a motor vehicle, at a software level and a hardware level, as illustrated in FIGS. 1 and 2. Power management system 11 implements controls to engage or disengage power draw from an internal power source 5 of the embedded device, at the software level and the hardware level. After the initial setup of the external power source 14 and internal power controls, the power supply for the operation of the embedded device 13 is uninterrupted, and occurs seamlessly when transitioning from the external power source 14 to the internal power source 5 and vice versa. With control over the external power source 14, the power management system provides protection to the external power source 14 against deep discharge, which can cause permanent damage. Together with control over the internal power, the power management system also provides on-demand coordination of the external power source 14 and the internal power source 5 selection so that the embedded device can be modified to adapt to the active power source that has been selected. The embedded device can be in the form of a plug in dongle that can be connected to the OBD-II communications port on a motor vehicle. Alternatively, the embedded device can be hard wired into the vehicle's power source.

The power management strategy involves hardware-imposed under- and over-voltage thresholds for the external power source 14 and the internal power source 5, and software thresholds for determining the health and usability of the power sources. The hardware portion of the solution also includes interrupt signals to wake microprocessor 20 from a sleep mode when certain external power voltage thresholds have been crossed. An example microprocessor 20 that could be used includes an ST Microelectronics STM32F427 Cortex M4 microprocessor.

The power management system 11 includes multiple interactive components illustrated in FIG. 1 including:

An external protection switch 1 between the external power source 14 and the embedded device, which includes microprocessor 20 along with other components. The external protection switch 1 can be controlled by hardware or software. An example external power switch is SI7115DN PFET power MOSFET or metal oxide semiconductor field-effect transistor.

An external power sense circuit 2 for measuring the voltage of the external power source 14. An example power sense circuit 2 is in the form of a DC input to the microprocessor 20.

An autonomous hardware external power under-voltage lockout control circuit 3 for the protection of the embedded device, which includes microprocessor 20. An example external power undervoltage detect circuit could include a NCP302LSN voltage supervisor.

An autonomous hardware external power overvoltage lockout control circuit 4 for the protection of the embedded device, which includes microprocessor 20.

The internal power source 5 (which can be an internal rechargeable battery such as a NiMH 5s rechargeable battery or lithium ion battery)

An internal power switch 6 between the internal power source 5 and the rest of the embedded device, which includes microprocessor 20. The internal power switch 6 can be controlled by hardware or software. An example internal power switch 6 could be a DMP2045 PFET power MOSFET.

An internal power under-voltage (UV) lockout control circuit 7 that controls the internal power switch 6. An example internal power undervoltage detect circuit could include a MAX9017 dual comparator and 74LVC2G02 dual NAND configured as SR latch.

An internal power sense circuit 8 for monitoring the voltage on the internal power source 5. An example internal power sense circuit could include an ADC input to the microprocessor 20.

An external power voltage monitoring circuit 9 that provide wake-up signals to the microprocessor 20, which can be individually set to different thresholds. An example external power voltage monitoring circuit could be a MAX9017 dual comparator. An example of an external power over voltage detect circuit could include a FMMT596 NPN transistor and MMSZ4714 ZENER diode.

Various status signals allow the microprocessor 20 to read the status of the hardware and measure the voltage of the internal power source 5 and the external power source 14.

The microprocessor 20 provides management of the power sources 5, 14. It also has several operational modes, from full operation down to low power sleep.

Software algorithms in the microprocessor 20 take the status and voltage information, and determine the appropriate operational mode.

An internal power charger circuit 13 for charging the internal power source 5. An example internal power charger circuit 13 could include an Analog Devices™ LTC4011 charger.

A power path control circuit 17. The power path control circuit 17 selects the appropriate power source, depending on the availability of the sources. An example power path control circuitry 14 could include two NTTFS5116PL PFETs controlled by a LTC4011 battery charger.

The power management system 11 is adapted to manage internal and external power sources 5, 14 for an embedded electronic device, which includes microprocessor 20 among other components as illustrated in FIG. 1. The system includes an internal power source 5 in the form of a battery and an external power source 14 such as 12 volt power from a vehicle or 24 volt power source. The system 11 determines when and how to power the internal electronic device or devices from either the internal or external power source 5, 14, when to charge the internal power source 5 with the internal power charger circuit 13, when to shut down the internal electronic device 13 so as not to over discharge and damage the internal power source 5 when external power 14 is not available. Internal embedded electronic devices can include GPS trackers, for example, that are used to track the location and real time speed of the motor vehicle as well as systems that monitor signals from the vehicle through the OBDII port to determine the status of the vehicle, whether the vehicle is running and whether there are any known issues.

The power management system 11 also determines whether the external power source 14 is providing too much or too little power. The present system measures external and internal voltage to make determinations and determines when to execute a reduced power consumption profile of the internal electronic device. The system is designed to switch between internal and external power 5, 14 without disrupting the function of the embedded electronic device.

There are several scenarios in which the power management system 11 operates, as illustrated in the flow diagram of FIG. 2. If the embedded electronic device 13 is not connected to an external power source 14 the external power switch 1 is closed and the system 11 awaits for the external power 14 to be connected. If, during that time, the internal power source 5 is depleted, the system 11 waits for the external power 14 to be available before charging the internal power source 5. At this stage, the embedded electronic device 13 is not operating.

If the embedded electronic device 13 is connected to an external power source 14 and the external power is within a nominal range (i.e. 12-14 volts in a 12 volt system) the external power source 14 is used to power the embedded electronic device 13. The microprocessor 20 is configured to wake up upon being signed by the external power under voltage detect circuit 3. The external power source 14 is used to charge the internal power source 5. The power management system 11 manually closes the internal power source switch to make it available to the embedded electronic device 13 in the event the external power source 14 fails.

If the power management system 11 determines that the internal power source 5 charging is completed, the external power source 14 is still used to power the embedded electronic device 13. The internal power source voltage increases to a nominal state.

In the event that the external power source 14 begins to decline below a monitored threshold voltage, the external power under voltage detect circuit 3 causes the microprocessor 20 to wake up. The external power under voltage engages opening the external power source switch 1 to protect the external power source 14. The power path control circuitry automatically begins drawing power from the internal power source 5 instead of the external power source 14. The power path control circuitry draws power from the internal power source 5 to provide uninterrupted power for embedded electronic device 13 operation. Having switched to the internal power source 5, the embedded electronic device 13 begins executing its reduced functionality operation to conserve power. The microprocessor 20 is configured to wake up upon being signaled by the external power voltage monitoring circuit 9 when the voltage of the external power source 14 raises back into a nominal range (i.e. 12-14 volts in a 12 volt system).

In the event that the external power source 14 is still not available and the internal power source 5 reaches a low power level, the internal power sense circuit 8 determines that the voltage is under a set threshold value. As the internal power source continues to decline, the power management system 11 enters shutdown mode, attempting to reduce to a bare minimum its power draw on the internal power source 5 awaiting for the external power source 14 to be restored to a level within the nominal range.

In the event that the internal power source 5 reaches an under-voltage condition and the external power is still locked out the internal power under-voltage lockout automatically engages opening the internal power source switch to protect the internal power source. At this point the embedded electronic device 13 is no longer powered and the embedded electronic device 13 does not operate.

Below is a table that illustrates how the embedded electronic device 13 operates through various states charge for the external power source 14 and the internal power source 5.

|  |  | Internal Power State | | |
| --- | --- | --- | --- | --- |
|  |  | Nominal | Below Low Level 1 | HW Undervoltage |
| External Power state | HW Overvoltage | Automatically switch to Internal Power by autonomous Ext. Power HW Undervoltage protection Disengage manual switch to External Power, although automatically will still be using Internal Power Configure External Power voltage monitors to wake-up device if it recovers. Reduced device functionality. Disable charging. | Disengage manual switch to External Power, although automatically will still be using Internal Power Configure External Power voltage monitors to wake-up device if it recovers. Engage manual disconnect of Internal Power. Enter Shutdown mode | device is unpowered |
|  | Nominal | Use External Power Normal behavior Top-off charging Configure External Power voltage monitors to wake-up device if it goes above or below given thresholds. | Use External Power Normal behavior Regular charging Configure External Power voltage monitors to wake-up device if it goes above or below given thresholds. | Use External Power Normal behavior Regular charging Configure External Power voltage monitors to wake-up device if it goes above or below given thresholds. |
|  | Below Low Level 1 | Wait 15 minutes before engaging manual switch to Internal Power through opening External Power switch Initially, normal behavior Initially, regular charging After switching to Internal Power, execute reduced power behavior After switching to Internal Power, disable charging Configure External Power voltage monitors to wake-up device if it goes above or below given thresholds. Configure External Power voltage monitors to wake-up device if it recovers. | Wait 15 minutes before engaging manual switch to Internal Power through opening External Power switch Initially, normal behavior Initially, regular charging After switching to Internal Power, execute reduced power behavior After switching to Internal Power, disable charging Configure External Power voltage monitors to wake-up device if it goes above or below given thresholds. Configure External Power voltage monitors to wake-up device if it recovers. | Wait 15 minutes before engaging manual switch to Internal Power through opening External Power switch Initially, normal behavior Initially, regular charging After switching to Internal Power, execute reduced power behavior After switching to Internal Power, disable charging Configure External Power voltage monitors to wake-up device if it goes above or below given thresholds. Configure External Power voltage monitors to wake-up device of it recovers. |
|  | Below Low Level n | Wait 3 minutes before engaging manual switch to Internal Power through opening External Power switch Initially, normal behavior Initially, regular charging After switching to Internal Power, execute reduced power behavior After switching to Internal Power, disable charging Configure External Power voltage monitors to wake-up device if it goes above of below given thresholds. | Wait 1 minute before engaging manual switch to Internal Power through opening External Power switch Initially, normal behavior Initially, regular charging After switching to Internal Power, execute reduced power behavior After switching to Internal Power, disable charging Configure External Power voltage monitors to wake-up device if it goes above of below given thresholds. | Wait 1 minute before engaging shutting down device. Initially, normal switch Initially, regular charging After time is up, disengage manual switch to External Power, although automatically will still be using Internal Power After time is up, configure External Power voltage monitors to wake-up device if it recovers After time is up, enter Shutdown mode Configure External Power |

-continued

| | Internal Power State | | |
|---|---|---|---|
| | Nominal | Below Low Level 1 | HW Undervoltage |
| HW Undervoltage | Configure External Power voltage monitors to wake-up device if it recovers.<br><br>Automatically switch to Internal Power by autonomous Ext. Power HW Undervoltage protection<br>Engage manual switch to Internal Power through opening External Power switch<br>Configure External Power voltage monitors to wake-up device if it recovers.<br>Execute reduced device functionality.<br>Disable charging. | Configure External Power voltage monitors to wake-up device if it recovers.<br><br>Disengage manual switch to External Power, although automatically will still be using Internal Power<br>Configure External Power voltage monitors to wake-up device if it recovers.<br>Engage manual disconnect of Internal Power.<br>Enter Shutdown mode | voltage monitors to wake-up device if it goes above or below given thresholds.<br>Configure External Power voltage monitors to wake-up device if it recovers.<br>device is unpowered |

The table below provides sample scenarios when the external power source 14 and the internal power source 5 are at various states of charge/discharge requiring the system to take certain actions for the embedded electronic device 13.

| Condition experienced by device | Device's reaction on External power control | Device's reaction on Internal Power control | Device's functional behavior |
|---|---|---|---|
| Device is initially not connected to an External power source | External power source switch is closed, awaiting for External power to be connected. | Internal Power source is depleted, awaiting for External power to be available to begin charging. | Device is not operating. |
| The device is connected to External power within the NOMINAL range. | External power source is used to power the device.<br>The device is configured to wake-up upon being signaled by the External power voltage monitoring circuits when it drops under a threshold. | External power source is used to charge the Internal Power source. Device manually closes the Internal Power source switch to make it available to the device in case External power source fails. | Device begins normal functional operation. Device operates normally, sometimes actively, and other times entering a reduced power mode (sleep). |
| Internal Power source charging completes cycle. | No change. | Internal Power source voltage increases to a NOMINAL state. | Device operates normally, sometimes actively, and other times entering a reduced power mode (sleep). |
| Over time, the External power source begins to decline below a monitored threshold, and the device wakes up. | External power Undervoltage Lockout automatically engages opening the External power source switch to protect the External power source.<br>The Power Path control circuitry automatically begins drawing power from Internal Power source.<br>The device is configured to wake-up upon being signaled by the External power voltage monitoring circuits when it raises back into a NOMINAL range. | The Power Path control circuitry automatically begins drawing power from Internal Power source, providing uninterrupted power for device operation. | Having switched to Internal Power, device begins executing its reduced functionality operation. |

-continued

| Condition experienced by device | Device's reaction on External power control | Device's reaction on Internal Power control | Device's functional behavior |
|---|---|---|---|
| Reduced functionality operation continues. | External power is still locked out. | Internal Power source begins to decline. | |
| The Internal Power reaches a low level. Device's software senses it is under a Software threshold. | External power is still locked out. | Internal Power source continues to decline. | Device enters Shutdown mode, attempting to reduce to bare minimum its power draw on the Internal Power, awaiting for External power to be restored to a level within the NOMINAL range. |
| The Internal Power reaches an undervoltage condition. | External power is still locked out. | Internal Power Undervoltage Lockout automatically engages opening the Internal Power source switch to protect the Internal Power source. | Device is unpowered. Device does not operate. |

Figure 3:
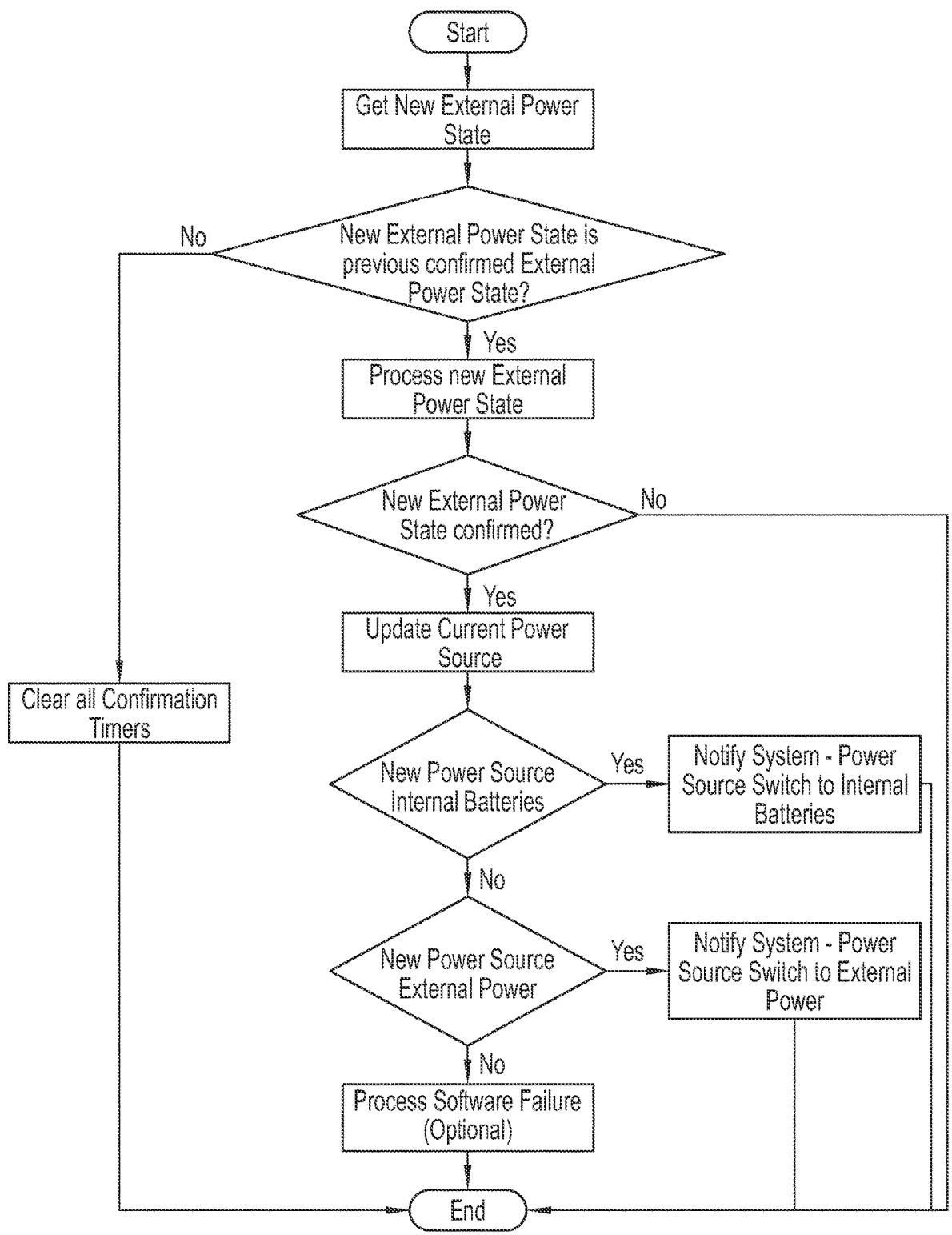
FIG. 3 is a flow diagram that illustrates power management of the power management system.

FIG. 3 is a flowchart that illustrates power management of the power management system 10. Power source updates only occur when the external power state of the external power source 14 changes. This relationship is highlighted in the external power state for 12 volt systems and external power state for 24 volt system tables below.

| External Power State for 12 volt Systems ||| 
|---|---|---|
| External Power State (12 V) | Power Source (12 V) | Is External Power Useable? |
| 0V | Internal | No |
| Present | External | Yes |
| Low | Internal/External | Yes |
| Weak | Internal | No |
| Lost | Internal | No |

| External Power State for 24 volt Systems ||| 
|---|---|---|
| External Power State (24 V) | Power Source (24 V) | Is External Power Useable? |
| 0V | Internal | No |
| Present | External | Yes |
| Low | Internal/External | Yes |
| Weak | Internal/External | Yes |
| Lost | Internal | No |

To confirm the new external power state, the system 11 must verify that the new external power state of the external power source 14 remains for a specific amount of time based on the new external power state that was detected, as illustrated in FIG. 2. The power management system 11 incorporates low battery detection and the current power source will be switched to the internal power source 5 (batteries) once the low power condition is confirmed. When the system 11 detects that the external power source 14 is low, it uses configurable thresholds to determine when the low battery condition is present. This condition is continuously evaluated when the external power voltage is greater than the configured threshold.

At this point, the system 10 is able to go to sleep to conserve energy if needed. During this condition, a 15 minute timer is set to allow the external power state determination to run. Once the external power voltage is less than the configured threshold it must remain lower than that threshold for a specific amount of time before the lower external power state is confirmed. At this moment, the low battery condition is true and the appropriate power source switch is executed.

The system can be in the form of a vehicle monitoring device that is adapted to receive signals and power from an on-board diagnostics port of a vehicle, such as an OBD II port that provides data signals from the vehicle computer. The vehicle monitoring device includes a microprocessor 20 adapted to receive signals from the vehicle. The system 11 includes an internal power source 5 that can be used to power the microprocessor 20. The system 20 also includes a charging system 13 configured to charge the internal power source 5 by using power from the vehicle. The microprocessor 20 is configured to determine whether the device 13 is or is not connected to the power source from the vehicle, if the microprocessor 20 does not detect power from the vehicle and the internal power source 5 is depleted, the microprocessor 20 waits for the power from the vehicle to be available before charging the internal power source 5 and powering the device 13. If the microprocessor 20 detects power from the vehicle and the power from the vehicle is within a threshold voltage, the microprocessor 20 uses power from the vehicle to power the device 13 and to charge the internal power source 5. If the microprocessor 20 detects that the power from the vehicle has declined below the threshold voltage (i.e. below 12 volts, for example), the microprocessor 20 discontinues drawing power from the vehicle and begins drawing power from the internal power source 5 to provide uninterrupted power to the device 13 without depleting the power from the vehicle. If the microprocessor 20 has to draw power from the internal power source 5 to power the device 13, the device 13 begins executing a reduced functionality operation to conserve power so that there is less of a power draw on the internal power source 5. In the event that power from the vehicle is below the threshold voltage and the internal power source 5 reaches a low power level (i.e. below 12 v), the microprocessor 20 is configured to reduce the power draw on the internal power source 5 while waiting for the power from the vehicle to be restored to the threshold voltage. When the internal power source reaches an under-voltage condition and the power from the vehicle is below the threshold voltage the device 13 goes into a sleep mode to conserve the internal power source 5.

Various features of the invention have been particularly shown and described in connection with the illustrative embodiment of the invention, however, it must be understood that these particular arrangements may merely illustrate, and that the invention is to be given its fullest interpretation within the terms of the appended claims.

What is claimed is:

1. A power management system for an embedded electronic device to manage internal and external power sources used to power the embedded electronic device, the power management system comprising: an internal power source for powering the embedded electronic device; a charging system configured to charge the internal power source from the external power source; a microprocessor that is configured to determine whether the embedded electronic device is or is not connected to an external power source, if the microprocessor does not detect an external power source and the internal power source is depleted, the microprocessor waits for the external power to be available before charging the internal power source and powering the embedded electronic device; if the microprocessor detects an external power source and the external power is within a threshold voltage, the external power source is used by the system to power the embedded electronic device and to charge the internal power source; if the microprocessor detects that the external power source declines below the threshold voltage, the microprocessor discontinues drawing power from the external power source and begins drawing power from the internal power source to provide uninterrupted power to the embedded electronic device without depleting the external power source.

2. The power management system of claim 1, wherein when the microprocessor draws power from the internal power source to power the embedded electronic device, the embedded electronic device begins executing a reduced functionality operation to conserve power.

3. The power management system of claim 2, wherein the microprocessor is configured to wake up upon being signaled by an external power voltage monitoring circuit when the voltage of the external power source raises back into a nominal range.

4. The power management system of claim 1, wherein in the event that the external power source is below the threshold voltage and the internal power source reaches a low power level, the system reduces the power draw on the internal power source while waiting for the external power source to be restored to the threshold voltage.

5. The power management system of claim 4, wherein when the internal power source reaches an under-voltage condition and the external power source is below the threshold voltage the embedded electronic device goes into a sleep mode.

6. A power management system for an embedded electronic device to manage internal and external power sources used to power the embedded electronic device comprising: an internal power source; a microprocessor; an external protection switch connected between the external power source and the embedded electronic device; an external power sense circuit configured to measure the voltage of the external power source; an internal power switch connected between the internal power source and the embedded device; an internal power under-voltage lockout control circuit that controls the internal power switch; an internal power sense circuit configured to monitor the voltage of the internal power source; an external power voltage monitoring circuit configured to monitor the voltage of the external power source; an internal power charger circuit configured to charge the internal power source; a power path control circuit that is configured to select the appropriate power source depending upon the availability of the external and internal power sources; wherein, the microprocessor is configured to determine when to power the embedded electronic device from either the internal or external power source, when to recharge the internal power source, and when to shut down the embedded electronic device so as not to over discharge and damage the internal power source when the external power is low or not available.

7. The power management system of claim 6 further including an external power under-voltage lockout control circuit configured to protect the embedded device from an external power under-voltage condition.

8. The power management system of claim 7 further including an external power over-voltage lockout control circuit configured to protect the embedded device from an external power over-voltage condition.

9. The power management system of claim 6, wherein when the microprocessor directs power from the internal power source to the embedded electronic device, the embedded electronic device begins executing a reduced functionality operation to conserve power.

10. The power management system of claim 7, wherein in the event that the external power source is below the threshold voltage and the internal power source reaches a low power level, the system reduces the power draw on the internal power source while waiting for the external power source to be restored to the threshold voltage.

11. The power management system of claim 10, wherein when the internal power source reaches an under-voltage condition and the external power source is below the threshold voltage the embedded electronic device is no longer powered.

12. A battery management method of an electrical device, having an internal power source and an external power source, the battery management method comprising the steps of: detecting, by a battery management unit, whether the electrical device is electrically connected with the external power source; determining, by the battery management unit, whether the external power is within a nominal range, and if the external power is below the nominal range then determining, by the battery management unit, whether the internal power source is above a threshold level; if it is determined that the external power source is below the nominal range and the internal power source is above a threshold level then the battery management unit is configured to power the electrical device using the internal power source while operating the device at a reduced functionality; if it is determined that the external power source is above the nominal range and the internal power source is above a threshold level then the battery management unit is configured to power the electrical device using the internal power source while operating the device at a reduced functionality and disables charging of the internal power source.

13. The battery management method of claim 12, wherein if it is determined that the external power source is below the nominal range and the internal power source is below the threshold level then the battery management unit is configured to shut down the electrical device.

14. The battery management method of claim 12, wherein if it is determined that the external power source is within the nominal range and the internal power source is fully charged, then the battery management unit is configured to power the electrical device using the external power source and discontinue charging the internal power source.

15. A vehicle monitoring device that is adapted to receive signals and power from an on-board diagnostics port of a vehicle, the vehicle systems monitor comprising: a microprocessor adapted to receive signals from the vehicle; an internal power source for powering the processor; a charging system configured to charge the internal power source from power from the vehicle; the microprocessor configured to determine whether the device is or is not connected to the power source from the vehicle, if the microprocessor does not detect power from the vehicle and the internal power source is depleted, the microprocessor waits for the power from the vehicle to be available before charging the internal power source and powering the device; if the microprocessor detects power from the vehicle and the power from the vehicle is within a threshold voltage, the processor uses power from the vehicle to power the device and to charge the internal power source; if the microprocessor detects that the power from the vehicle has declined below the threshold voltage, the microprocessor discontinues drawing power from the vehicle and begins drawing power from the internal power source to provide uninterrupted power to the device without depleting the power from the vehicle.

16. The vehicle monitoring device of claim 15, wherein when the microprocessor draws power from the internal power source to power the device, the device begins executing a reduced functionality operation to conserve power.

17. The vehicle monitoring device of claim 15, wherein in the event that power from the vehicle is below the threshold voltage and the internal power source reaches a low power level, the microprocessor is configured to reduce the power draw on the internal power source while waiting for the power from the vehicle to be restored to the threshold voltage.

18. The power management system of claim 17, wherein when the internal power source reaches an under-voltage condition and the power from the vehicle is below the threshold voltage the electronic device goes into a sleep mode.

* * * * *